US006210744B1

United States Patent
Hayess et al.

(10) Patent No.: US 6,210,744 B1
(45) Date of Patent: Apr. 3, 2001

(54) COATING DEVICE AND METHOD FOR COATING A COMPONENT WITH A THERMAL BARRIER COATING

(75) Inventors: Burkhard Hayess, Rangsdorf; Wolfram Beele, Ratingen, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/201,725

(22) Filed: Nov. 30, 1998

Related U.S. Application Data

(63) Continuation of application No. PCT/DE97/01037, filed on May 22, 1997.

(30) Foreign Application Priority Data

May 30, 1996 (DE) .............................................. 196 21 755

(51) Int. Cl.$^7$ .................................................. C23C 14/30
(52) U.S. Cl. .............................. 427/8; 427/585; 427/596; 427/255.29; 427/255.32; 427/255.36; 204/192.16
(58) Field of Search ................................ 427/8, 585, 596, 427/255.29, 255.32, 255.36; 204/192.16

(56) References Cited

U.S. PATENT DOCUMENTS

| 4,676,994 | * | 6/1987 | Demaray ............................ 427/566 |
| 5,238,752 |   | 8/1993 | Duderstadt et al. ................ 428/623 |
| 5,716,720 | * | 2/1998 | Murphy ............................... 428/623 |

FOREIGN PATENT DOCUMENTS

| 299 902 A7 | 10/1989 | (DE) . |
| 195 22 331 A1 | 1/1996 | (DE) . |
| 0 005 641 A1 | 11/1979 | (EP) . |

OTHER PUBLICATIONS

"Zirconia thin film deposition on silicon by reactive gas flow sputtering: the influence of low energy particle bombardment" (Jung et al.), Materials Science and Engineerung, A 140, 1991, pp. 528–533, (no month).

"High rate deposition of alumina films by reactive gas flow sputtering" (Jung et al.), Surface and Coatings Technology, 59, 1993, pp. 171–176, (no month).

"A microprocessor controlled, dry pumped, high–vacuum coating system for thick film depositions", Solid State Technology, vol. 25, No. 4, Apr. 1982.

* cited by examiner

Primary Examiner—Timothy Meeks
(74) Attorney, Agent, or Firm—Herbert L. Lerner; Laurence A. Greenberg; Werner H. Stemer

(57) ABSTRACT

A method for coating a component with a thermal barrier coating, includes placing the component in a coating chamber and maintaining the component at a component temperature. A vacuum is established in the coating chamber. The process parameters vacuum pressure and component temperature are controlled together, at least during the coating process with a deposition of material forming the thermal barrier coating. The control takes place in such a way that the parameters are in a respective set-point value range and the thermal barrier coating grows with a columnar structure on the component. A coating device is also provided.

15 Claims, 3 Drawing Sheets

COATING DEVICE AND METHOD FOR COATING A COMPONENT WITH A THERMAL BARRIER COATING

CROSS-REFERENCE TO RELATED APPLICATION

This application is a continuation of copending International application No. PCT/DE97/01037, filed on May 22, 1997, which designated the United States.

BACKGROUND OF THE INVENTION

Field of the Invention

The invention relates to a method for coating a component with a thermal barrier coating, in which the component is disposed in a coating chamber. The invention further relates to a coating device for producing the thermal insulation on a component, having a heating device for heating the component and a vacuum-generating device.

U.S. Pat. No. 5,238,752 describes a method for producing a thermal insulation layer system having an intermetallic bond coating for a small metallic component, in particular an aircraft engine blade having a length dimension of about 5 cm. The actual thermal insulation layer, made of zirconium oxide, is deposited on the component through the use of an electron-beam PVD (physical vapor deposition) method, with zirconium oxide and yttrium oxide being evaporated from a metal-oxide body using an electron gun. The method is carried out in a device in which the component is heated to a temperature of about 950° C. to 1000° C., before the coating process. A heater is provided in the device for heating the component from above, if appropriate, in addition to heating due to the zirconium oxide to be deposited, and radiation emerging from the surface of the evaporating ceramic body. In order to deposit the zirconium oxide, a vacuum of about $7 \times 10^{-3}$ Pa ($7 \times 10^{-5}$ mbar) is generated in the device, and a deposition rate of about 100 µm/h to 250 µm/h is achieved with the electron gun. With that operating set-up, the intention is for a thermal barrier coating of zirconium oxide with a columnar microstructure to be formed on the all-metallic component.

U.S. Pat. No. 4,676,994 describes a method for depositing a ceramic coating on a substrate that has a ceramic surface in that case, in which a first ceramic material is heated in vacuo by an electron beam in such a way that it forms a sub-stoichiometric ceramic fluid. The substrate is heated in vacuo to a temperature of above 900° C. and the first ceramic material is sub-stoichiometrically vacuum-evaporated thereon in order to form a dense ceramic layer. A layer of a ceramic with columnar orientation is deposited on that dense ceramic layer. During the vapor deposition of the sub-stoichiometric ceramic for producing the dense ceramic layer, the substrate temperature is maintained at a value between 900° C. and 1200° C., and the vacuum pressure is preferably below $13 \times 10^{-3}$ Pa. During the coating of the dense ceramic layer with the columnar ceramic layer there is an oxygen partial pressure between $60 \times 10^{-3}$ Pa to 0.27 Pa, and the combined partial pressure of other gases is less than 10% of the total pressure. The method was, for example, carried out on a gas-turbine blade having a maximum length of 10 cm.

German Published, Non-Prosecuted Patent Application DE 195 22 331 A1 describes a cathodic arc-evaporation method for the production, in particular, of metal oxide layers and layers of alloy oxides. In that case, a target is evaporated in an atmosphere including oxygen through the use of cathodic arc evaporation, so that the oxide of the metal alloy is essentially in a single crystallographic phase. The oxygen partial pressure during the coating process is observed, and deviations from a set-point partial pressure are minimized by setting at least one of the parameters: oxygen mass flow, arcing voltage or field strength of a magnetic field essentially perpendicular to the target surface. As an alternative, the arcing voltage is observed, and deviations from a set-arcing voltage are minimized by setting at least one of the parameters: oxygen mass flow or the magnetic field. As a third alternative possibility, the frequency spectrum of the discharge current is observed and deviations of characteristic components of the spectrum from set-point characteristics are minimized by setting the arcing voltage, the oxygen mass flow or the magnetic field. The above-mentioned parameters are preferably set automatically by a control loop for the working point of the process. In that case the method is exclusively intended for applying a coating of an aluminum oxide or a chromium oxide.

German Patent DD 299 902 A7 describes a method for operating a plasma arc of a hollow-cathode evaporator source, in which an emergency switch-off is substantially avoided in the event of operationally induced non-uniformities of the plasma arc occurring. In that case, a logic signal is formed as a function of a voltage drop between the hollow cathode and an evaporator crucible, or of a discharge current which is set up from the potential of the vacuum chamber through a resistor to the anode. Measures are taken to avoid an emergency switch-off depending on the value of that logic signal.

In an article entitled "Zirconia Thin Film Deposition on Silicon by Reactive Gas Flow Sputtering: The Influence of Low Energy Particle Bombardment" by T. Jung and A. Westphal, in Material Science and Engineering, A 140, 191, pages 528 to 533, the so-called reactive gas flow sputtering method is put forward for the production of a zirconium oxide layer on a semi-conductive substrate, in particular based on silicon. According to that sputtering method, an inert gas, in particular argon, is fed through a hollow cathode, in the interior of which an anode is disposed, so that ionization of the argon atoms takes place. The atoms strike the metallic cathode, formed of zirconium, as a result of which metal atoms and/or metal clusters are detached therefrom and are entrained with the inert gas flow. Outside the cathode, oxygen is supplied with a partial pressure of 10 Pa to about $10^{-4}$ Pa, for full oxidation of the metallic zirconium. The semiconductor substrate is fastened in a stainless steel holder that can be heated to 800° C., and is heated to a temperature of about 400° C. The method is carried out in a coating chamber which is evacuated to a high vacuum of about $10^{-7}$ Pa. The deposition rate is about 0.9 µm h$^{-1}$.

An alternative structure of a hollow cathode for the reactive gas flow sputtering method is described in an article entitled "High Rated Deposition of Alumina Films by Reactive Gas Flow Sputtering" by T. Jung and A. Westphal, in Surface and Coatings Technology, 59, 1993, pages 171 to 176. The hollow cathode specified therein has a linear structure, insofar as zirconium plates are disposed next to one another in a housing. An inert gas flow can be fed through between each pair of neighboring plates, so that a plasma of inert gas atoms is formed between neighboring plates. Using the method, test-pieces of silicon, stainless steel and glass were coated with aluminum oxide. During the coating, the temperature of a test-piece was between 100° C. and 200° C. The pressure inside the coating chamber was about $10^{-8}$ Pa, and the amount of oxygen supplied was 4.5 cm$^3$ min$^{-1}$. The deposited aluminum layer had a thickness of from 0.5 µm to 6.0 µm and an essentially γ-microstructure.

SUMMARY OF THE INVENTION

It is accordingly an object of the invention to provide a coating device and a method for coating a component with a thermal barrier coating, which overcome the hereinaforementioned disadvantages of the heretofore-known devices and methods of this general type and which achieve greater stability against cyclic thermal loading.

With the foregoing and other objects in view there is provided, in accordance with the invention, a method for coating a component with a thermal insulation layer, which comprises placing a component in a coating chamber; maintaining the component at a component temperature; establishing a vacuum in the coating chamber; and controlling at least two process parameters selected from the group consisting of vacuum pressure, component temperature and atmosphere composition with a control device, at least during a coating process for depositing a material forming a thermal insulation layer on the component, and placing the at least two process parameters influenced by interactions in a respective set-point value range for growing the thermal barrier coating with a ceramic columnar, fringe, fingery or spiky structure on the component.

By virtue of the regulated process control according to the invention, the process parameters are in a parameter window that is to be respected, which ensures that the required layer structure will be adhered to. Preferably, the essential process parameters are controlled together and simultaneously.

Set-point value ranges of this type include, for example, known structure zone models for coatings produced through the use of PVD (physical vapor deposition) or they can be drawn from experimental investigations. Controlling the vacuum pressure, the component temperature and the atmosphere in common during the coating process ensures that the process parameters are reliably in the predetermined set-point value ranges, and therefore a thermal barrier coating having a columnar microstructure is produced. This is advantageous, in particular, in comparison with a method in which merely unmonitored presetting of the process parameters is carried out, or independent regulational control of each individual process parameter takes place. This is because in those cases there is the danger that, even though a process parameter is in the allowed set-point value range, the other process parameter is outside the set-point value range. That entails the risk that a thermal barrier coating with a sufficiently rod-like microstructure will not be deposited constantly during the coating process. That problem arises, in particular, with large components and components, for example gas turbine blades of industrial gas turbines, of the type having greatly varying spatial mass concentration. In the case of such components, for example with increasing thickness of the thermal barrier coating, a local heat loss through radiation and/or thermal conduction may take place inside the component, so that continuous monitoring and control of the actual temperature of the component and a further process parameter inside the coating chamber may be necessary in order to form a columnar microstructure of the thermal barrier coating.

A thermal barrier coating having a columnar structure, in which the rod-like ceramic columns are preferably oriented normal to the surface of the component, is particularly well-suited for taking up cyclic thermal loads. To this end, in particular, a fine columnar structure having a mean column diameter of less than 10 $\mu$m, in particular less than 5 $\mu$m, is particularly advantageous since a high expansion point is thereby achieved. Differences in the coefficients of thermal expansion of the (in particular) metallic component and the ceramic thermal insulation layer are balanced well. This is advantageous, in particular, for components of an industrial gas turbine, for example a combustion-chamber-lining and a gas turbine blade, since they are exposed to temperature fluctuations between room temperature and more than 1000° C. Suitable thermal barrier coatings in this case are metal-oxide ceramics, for example based on zirconium oxide, partially stabilized with yttrium oxide, or metal nitrides. Suitable methods for producing the material that forms the thermal barrier coating include all PVD methods, for example an electron-beam PVD method, the reactive gas flow sputtering method, or methods which lead to evaporation of the coating material, for example thermal spraying in high vacuum.

Preferably, in addition to the process parameters of vacuum pressure and component temperature, for achieving a thermal insulation layer with a columnar microstructure, further process parameters and/or system parameters, in particular ones determining the gas or atmosphere composition, are controlled in common, so that the entire coating process runs automatically without human intervention. Even in the event of disruption in the corresponding coating device, action can thereby automatically be taken flexibly on the coating process. With real-time monitoring of the relevant process parameters, in particular vacuum pressure, component temperature and gas composition in the coating chamber, process adaptation takes place even under the effect of disturbances.

In accordance with another mode of the invention, if a reactive gas is fed into the coating chamber during the coating process, then the process parameters of reactive gas input rate and/or partial pressure of the reactive gas are preferably controlled in common with other process parameters. A controlled feed of the reactive gas ensures that the thermal barrier coating has a suitable chemical composition. In particular in the case of the thermal barrier coating made of a metal oxide ceramic, complete oxidation of the metal, for example zirconium, magnesium or aluminum, is achieved by supplying oxygen as a reactive gas. When nitrogen is used as the reaction gas, the prescribed nitriding of corresponding metals is achieved.

Along with the process parameters, the system states and parameters which have an effect on the deposition of the thermal barrier coating, are preferably controlled together. This includes, for example, controlling a relative motion which the component executes relative to a coating source for producing the material of the thermal barrier coating. This relative motion is preferably a rotation of the component about a longitudinal axis, so that the material, for example zirconium oxide partially stabilized with yttrium oxide, is deposited uniformly over the entire surface of the component. A further movement may be superposed with the relative motion, for example a translation for the purpose of coating components having greater length. A further system parameter, which in particular determines the growth rate of the thermal barrier coating, is the material output of the coating source. In the case of an electron-beam PVD method, this is characterized by the power of the electron gun with which ceramic particles are evaporated form a ceramic body, and the forward feed of the coating material. When the reactive gas flow sputtering method is used, the voltage between the cathode and the anode, and the throughput of inert gas, for example argon, is of importance for the material output of the coating source.

In accordance with a further mode of the invention, the set-point value range for the component temperature is, in particular, between 900° C. and 1150° C., in particular between 950° C. and 1050° C. when coating a metallic component of a gas turbine system. The set-point value range for the vacuum pressure is between 10 Pa ($10^{-1}$ mbar) and $10^{-5}$ Pa ($10^{-7}$ mbar), in particular between $10^{-2}$ Pa ($10^{-4}$ mbar) and $10^{-4}$ Pa ($10^{-6}$ mbar), when using the reactive gas flow sputtering method. The above-mentioned set-point value ranges for component temperature and vacuum pressure provide good adhesion of the metal-ceramic layer to the component, if appropriate by the intermediary of one or more bond coating layers. They also provide good balancing of the different coefficients of thermal expansion by the columnar microstructure of the thermal barrier coating.

In accordance with an added mode of the invention, the partial pressure of the reactive gas is preferably in a set-point value range of between 10 Pa ($10^{-1}$ mbar) and $10^{-2}$ Pa ($10^{-4}$ mbar), in particular about 1 Pa ($10^{-2}$ mbar). This ensures that reactive gas, oxygen for oxidation or nitrogen for nitriding, is present in a sufficient quantity, which ensures the required chemical composition of the thermal barrier coating.

In accordance with an additional mode of the invention, the method is particularly suitable for a component having sub-regions of greatly differing mass concentration. Preferably, substantially uniformly heating is set up through the component. This is advantageous, in particular with gas turbine blades, in which there is a thin-walled blade profile and a thick-walled root part or shroud part. The uniform heating, and the adherence to a set-point value range for the component temperature, ensure uniformly good bonding of the thermal barrier coating and formation of the columnar structure over the entire component surface to be coated. Preferably, a maximum temperature range of ±50 K as a deviation from the set-point value is not exceeded.

In accordance with yet another mode of the invention, the wall thickness in the first sub-region, the thin-walled sub-region, is in a ratio of 1:5 to 1:200, in particular 1:10 to 1:100, to the wall thickness of the second sub-region, the thick-walled or full-metal part. The component, in particular a turbine blade of an industrial gas turbine may have a mass of between 1 kg and 15 kg. In the case of a rotating blade, the thin-walled blade profile region, extending along a longitudinal axis, may have an extent of more than 20 cm.

With the objects of the invention in view there is also provided a coating device for coating a metal component of a gas turbine through physical vapor deposition by applying a ceramic fringe crystal thermal barrier coating on the component, comprising a heating device for heating the component; a vacuum-generating device, in particular a vacuum pump; a vacuum-pressure measuring device; at least one temperature sensor for determining a temperature of the component; and a control device connected to the heating device, the vacuum-generating device, the vacuum-pressure measuring device and the temperature sensor for jointly controlling at least two process parameters selected from the group consisting of temperature of the component, vacuum pressure and gas composition during a PVD coating process.

A coating device, in which the temperature of the component, the vacuum pressure and the atmosphere composition in the coating device can be monitored continuously during the coating process, and the process parameters of temperature, vacuum pressure and atmosphere composition can be controlled together through the use of a control device, ensures that the set-point value ranges for the process parameters which are necessary for achieving a columnar microstructure of the thermal barrier coating, are adhered to. With the device, it is therefore also possible for components having large local fluctuation in mass concentration, for example a turbine blade of an industrial gas turbine, to be coated with a thermal barrier coating which exhibits good adhesion to the component and great stability against cyclic thermal loads. Further process parameters and system parameters for operating the coating device can be controlled together by using the control device. This provides, in addition to the conditions for achieving a columnar microstructure of the thermal barrier coating, the deposition rate, the degree of oxidation of the material forming the thermal barrier coating, in particular a metal oxide, and control of the motion of the component in the coating device.

In accordance with another feature of the invention, in order to carry out the reactive gas flow sputtering method, the coating device has a coating source including a hollow cathode, through which an inert gas such as argon can flow, a cathode material and an anode. It also has a holding device for positioning the component. The hollow cathode has a gas outlet opening facing the holding device, as well as a gas inlet opening for the inert gas. The cathode material preferably is formed of an alloy including zirconium and a stabilizer metal, for example yttrium. Furthermore, a feed for a reactive gas, in particular an oxidant feed for oxidation of the zirconium, is provided outside the hollow cathode. The zirconium or yttrium entrained with the inert gas let out from the hollow cathode is oxidized completely by supplying oxygen and is deposited on the component as a thermal barrier coating of zirconium oxide partially stabilized with yttrium oxide. This thermal barrier coating has a columnar microstructure with an average diameter of preferably between 0.3 $\mu$m and 5.0 $\mu$m and with the ceramic columns being oriented essentially normal to the surface of the component. It is, of course, possible for the cathode to be made of a different material, for example magnesium or aluminum. Instead of oxygen, it is also possible to feed nitrogen to the metal emerging from the hollow cathode, which produces corresponding metal nitrides. The coating device may likewise be constructed for carrying out an electron-beam PVD method with a corresponding electron gun and further components needed therefor, which are controlled by the control device in accordance with the requisite set-point value ranges for the process parameters. The process parameters may in this case be the electrical quantities (voltage/current or voltage/power) of the electron gun, control parameters of a defocussing and electron-beam deflection system and pump control quantities, such as pressure in the cathode chamber and/or intermediate-stage pressure.

In accordance with a concomitant feature of the invention, the control device is preferably constructed hierarchically, with a master system for coordinating the overall running of the coating process, and a multiplicity of subsystems, each for controlling one or more process and/or system parameters. The master system and the subsystems may be disposed spatially separated from one another. The master system provides real-time monitoring of the relevant process and system parameters for overall process control, in particular under the effect of disturbances. The subsystems are managed by the master system. Corresponding programming of the master system, which is preferably constructed in the form of a memory-programmable process control system, leads to a flexible definition for the entire coating process. Through the use thereof, a defined and stable environmental condition can be achieved in the coating atmosphere for the component, in particular a turbine blade. A defined layer thickness distribution along the surface to be coated is thereby provided in a simple manner for such a turbine blade, by virtue of the flexible process control. The adherence to the set-point value ranges for the essential coating process parameters, for example temperature of the component, vacuum pressure and gas composition, is adhered to reliably by the control device.

Other features which are considered as characteristic for the invention are set forth in the appended claims.

Although the invention is illustrated and described herein as embodied in a coating device and a method for coating a component with a thermal barrier coating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
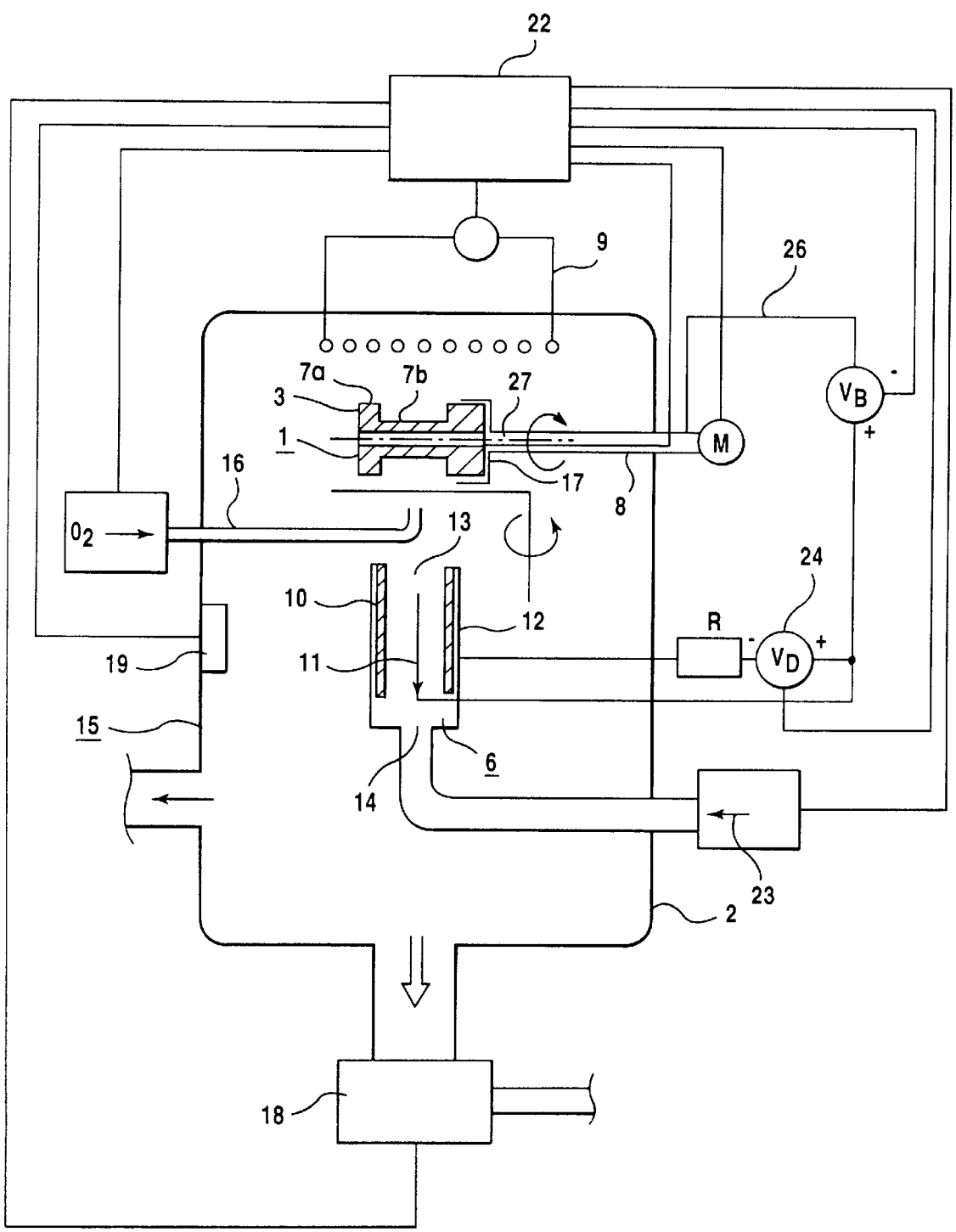
FIGS. 1 and 2 are each schematic and diagrammatic views of a coating device with a control device.

Referring now to the figures of the drawings in detail and first, particularly, to FIG. 1 thereof, there is seen a schematic and diagrammatic representation which is not to scale, of a coating device 15 for carrying out a reactive gas flow sputtering method. The coating device has a coating chamber 2, in which a vacuum of below 1 mbar can be produced by a vacuum-generating device 18. A hollow cathode 10, which is directed along a longitudinal axis and has a circular cylindrical cross-section, is disposed inside the coating chamber 2. A rod-like anode 11, which is connected through a DC voltage supply 24 to the hollow cathode 10, is disposed inside the hollow cathode 10. The DC voltage supply 24 is also connected to a control device 22. The hollow cathode 10 has a cathode material 12 which is constructed as a hollow cylinder or, for example, is formed of individual plates filling an internal wall of the hollow cathode 10. The cathode material 12 is zirconium, with which yttrium is alloyed in a predetermined ratio, for example 3% by weight to 10% by weight. The hollow cathode 10 has a gas inlet opening 14 which is connected to a non-illustrated gas supply for feeding an inert gas 23, in particular argon. An inert gas flow which is needed therefor is controlled through the use of the control device 22. The hollow cathode 10 has a gas outlet opening 13 on an opposite side from the gas inlet opening 14. The inert gas 23 can flow out from the gas outlet opening 13 after passing through a region between the cathode material 12 and the anode 11. A feed 16 for reactive gas is disposed geodetically above the gas outlet opening 13. The feed 16, which in this case is an oxidant feed, has an outlet region through which oxygen can be fed into the coating chamber 2 under control by the control device 22.

A component 1, which is diagrammatically represented herein as a gas turbine blade, is held in a holding device 8 disposed geodetically above the oxidant feed 16. The holding device 8 can be electrically connected through an auxiliary voltage supply 26 to the hollow cathode 10. The auxiliary voltage supply 26 is driven by the control device 22. A respective DC voltage, which can be applied to the component 1 between the hollow cathode 10 and the holding device 8, can be used for cleaning the surface of the component 1 using ionized inert gas atoms. The holding device 8 preferably has a drive device which is connected to the control device 22. The drive device ensures continuous rotation of the component 1 about its longitudinal axis 27. A heating device 9 for heating the component 1 by thermal radiation and/or convection is disposed geodetically above the component 1 and is also connected to the control device 22. Of course, the heating device 9 may, if required, also be disposed on the same geodetic level next to the component 1. A vacuum-pressure measuring device 19, which is likewise connected to the control device 22, is furthermore provided in the coating chamber 2. At least one temperature sensor 17, for example a thermocouple, which is likewise connected to the control device 22, is disposed on the component 1 to detect its component temperature or component temperature distribution. The vacuum-generating device 18 is also connected to the control device 22.

Figure 3:
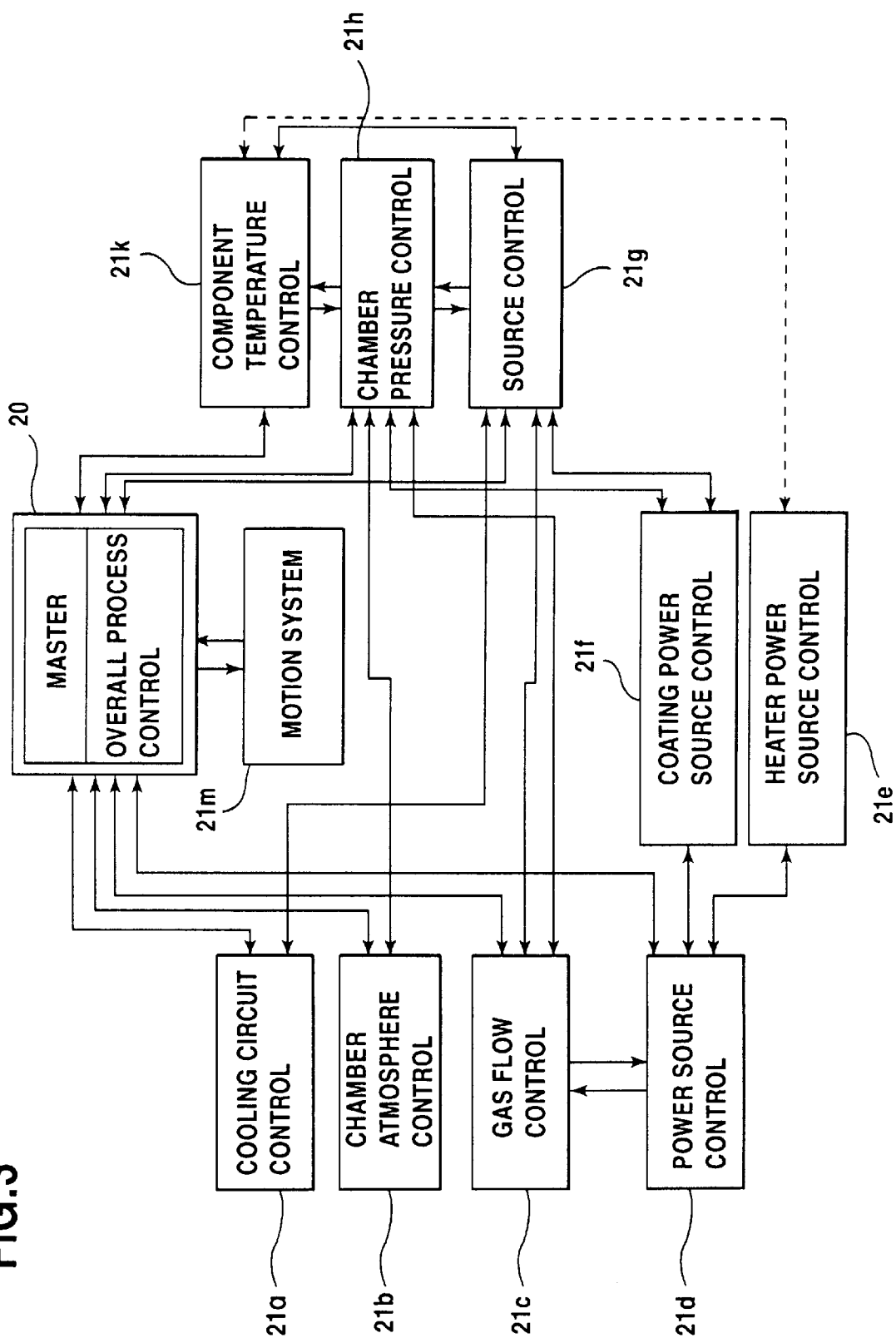
FIG. 3 is a block circuit diagram of a control device.

As is schematically represented in FIG. 3, the control device 22 has a master system 20, to which a multiplicity of subsystems $21a$ to $21m$ are assigned and subordinated. The master system 20 undertakes coordination tasks for controlling an entire coating cycle, in particular system parameters of the coating device 15, process control and movement control of the component 1. A chronological overall running of the coating process and management of the individual subsystems $21a$ to $21m$ and their control loops, are undertaken by the master system 20.

In terms of process control, a complete coating process can be divided into sub-tasks as follows:

a) setting up a component state before the coating (preheating to seeding temperature, reducing ambient pressure to coating pressure);

b) depositing a thermal barrier coating with requisite properties in terms of structure, adhesion and layer thickness; and c) returning the component state to ambient conditions (room temperature and atmospheric air pressure).

The process control by the master system 20 is effected in such a way that the respectively required subsystems $21a$ to $21m$ are activated and the relevant process and/or system parameters are corrected, for the chronological running of the individual process steps.

Throughout a coating cycle, a cooling-cycle control $21a$ cools all components to be cooled in the coating device 15 as well as further non-illustrated system parts, so that they are kept at a constant temperature for unimpaired operation. In the case of a coating device 15 which also contains a non-illustrated loading chamber connected to a likewise non-illustrated lock, in addition to containing the coating chamber 2, the component 1 is preheated, preferably in the loading chamber. It is, of course, also possible to provide an independent preheating chamber which is used for preheating and is spatially separated, for example by a lock, from the loading chamber. The loading chamber is evacuated to a pressure of 10 mbar with control being carried out through the subsystem $21h$, which is a chamber pressure control. A set-point or desired value of the chamber pressure can be set freely. The chamber pressure control $21h$ controls a vacuum-pump status with the pressure-measuring device 19, and has a separately programmable pressure-control circuit which serves for correcting the pressure within a freely settable pressure variation. The loading chamber is then flooded to 200 mbar with argon, re-evacuated to 10 mbar and subsequently flooded once more to 800 mbar, with argon. Convective preheating of the component to 700° C. then takes place. This being the case, the pressure in the loading chamber is kept constant through the use of the chamber-pressure control subsystem 21*h*.

The heating of the component 1 is controlled at the same time by a subsystem heater power source control 21*e* and a component temperature control 21*k*. To this end, measured values of the temperature sensor 17 are evaluated, and a heating gradient is determined therefrom. A set-point value can be prescribed for the heating gradient, wherein this value is used as a control value for the heater power supply control subsystem 21*e*. Further process and system parameters include a preheating temperature for the component 1, and a fan speed for producing the convective preheating through the use of a non-illustrated fan. In order to provide uniform preheating, the component 1 is rotated about its longitudinal axis 27, which is controlled by a motion system subsystem 21*m*. The reaching of the preheating temperature, in particular 700° C., is detected by the component temperature control subsystem 21*k*. After this, there is a change to radiation heating of the component 1. To this end, the non-illustrated fan is switched off and new set-point values are prescribed for the component temperature and the chamber pressure which correspond to the required seeding temperature and the coating pressure in the coating chamber 2.

In the coating chamber 2, a gas flow control subsystem 21*c* and a power source control subsystem 21*d* are used to control the supply of reactive gas for setting up the required gas atom stoichiometry for the coating deposition. A source control subsystem 21*g* and a coating power source control subsystem 21*f* are used to activate a coating source 6 and to correct a concentration of the coating material, in particular zirconium, in a metal atom cloud.

The component temperature control subsystem 21*k* detects the reaching of the seeding temperature. If the seeding temperature and the coating pressure are reached at the same time, then the heater power source control subsystem 21*e* is switched off. The lock between the loading chamber and the coating chamber 2 is opened and a movement system subsystem 21*m* is used to control a shifting of the component 1 into the coating chamber 2. The chamber pressure in the coating chamber 2 is adjusted through the use of the chamber pressure control subsystem 21*h* to a freely prescribable set-point value range of the vacuum pressure. The coating source 6 is adjusted to the steady-state condition for the deposition process, through the use of the coating source control subsystem 21*g*, before the component 1 is introduced into the coating chamber 2. During the deposition process, the chamber pressure control subsystem 21*h* is used to correct the vacuum pressure in the prescribed set-point value range. This is done at the same time as an adjustment, formed by the component temperature control subsystem 21*k*, of the component temperature in the prescribed set-point value range for obtaining a ceramic thermal barrier coating 3 with a columnar microstructure. The thermal barrier coating 3 may be described as having a columnar, fringe, fingery or spiky structure. At the same time, the gas atmosphere is controlled through the use of a chamber atmosphere control subsystem 21*b*. The motion system subsystem 21*m* is used to effect deliberate motion control of the component 1 for particularly favorable utilization of the cloud of coating material produced by the coating source 6 and the supply of reactive gas 16. The gas flow control subsystem 21*c* is used to set the steady-state supply of reactive gas into the coating chamber 2 within a defined variation for the chamber atmosphere (chamber atmosphere control subsystem 21*b*). Elevated oxygen partial pressures, which may lead to the formation of arc discharges in the coating source 6, are detected early by monitoring the flow of current and/or the voltage of the coating source 6 and by prompt reduction of the power of the coating source 6. This is, in particular, performed by the current source control subsystem 21*d*.

After the coating process has been completed, the component 1 is removed from the coating chamber 2 and placed in the loading chamber, and is cooled to about 500° C. with prescribed cooling gradients. The pressure is increased in the loading chamber by injecting argon and activating the fan, with non-illustrated cooling devices being used as a heat sink. The cooling is monitored by the temperature sensor 27 and the component temperature control subsystem 21*k*. The cooling rate is corrected adaptively by pressure control, control of the fan speed and control of the injection of argon. After the component temperature has cooled to 500° C. the pressure in the loading chamber is set to more than one bar by injection of argon through the use of the chamber atmosphere control subsystem 21*h*. The component is cooled with a high cooling gradient to about 100° C. Controlled pressure equilibration between the loading chamber and the surrounding atmosphere then occurs through the use of the chamber pressure control subsystem 21*h*. The complete coating cycle, coordinated by the master system 20, is thereby concluded. The process establishes substantially uniform heating through a component 1 such as a rotating blade or guide vane of an industrial gas turbine having sub-regions 7*a*, 7*b* of greatly different mass concentration. The component 1 has a first sub-region 7*a* with a first wall thickness and a second sub-region 7*b* with a second wall thickness. The wall thicknesses are in a ratio of 1:5 to 1:200, in particular 1:10 to 1:100 relative to one another. The coating process can be carried out for any suitable coating method, in particular a PVD method, for example the reactive gas flow sputtering method or the electron-beam PVD method.

A coating process using an electron-beam PVD method can be carried out in a similar manner to the process presented above, with a corresponding coating device 15.

Figure 2:
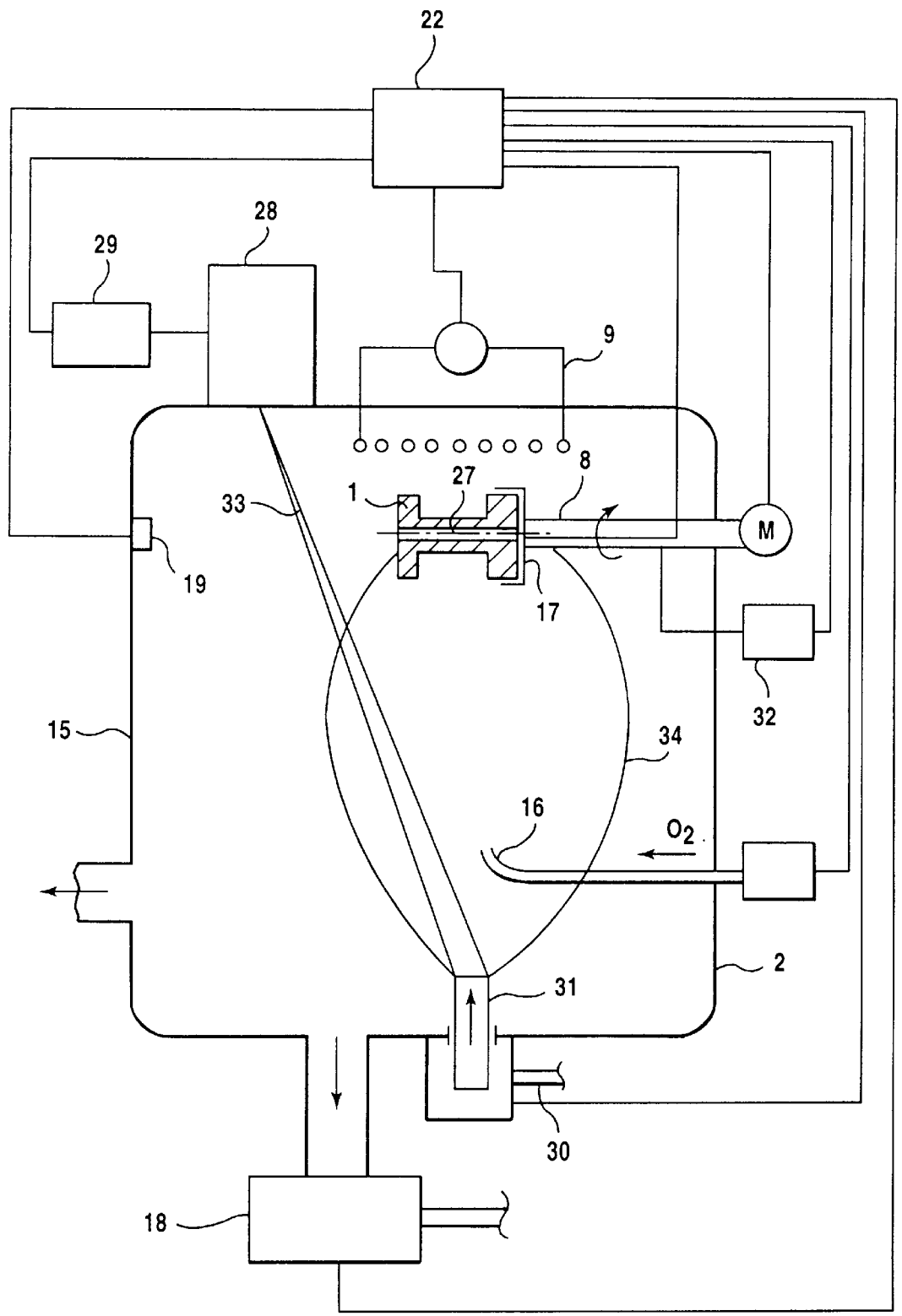

An explanation is provided by referring to FIG. 2 which is a diagrammatic and schematic representation, not to scale, of a coating device 15 for carrying out an electron-beam PVD method. The coating device has a coating chamber 2, in which a vacuum of below $10^{-2}$ Pa can be produced by a vacuum-generating device 18. An electron gun 28 which is disposed outside the coating chamber 2 is connected to a power supply 29. There is also a connection between the power supply 29 and the control device 22. A forward feed or advancing device 30, which is disposed geodetically below the electron gun 28, feeds a ceramic coating material 31 in rod or ingot form into the coating chamber 2. The forward feed device 30 is also connected to the control device 22. A component 1, which in this case is diagrammatically represented as a gas turbine blade, is held geodetically above the forward feed device 30 in a holding device 8. The holding device 8 is connected to an auxiliary voltage supply 32 which is in turn connected to the control device 22. A DC voltage, which can be applied between the auxiliary voltage supply 32 and the holding device 8, or more precisely the component 1, can be used for cleaning the surface of the component 1 by ionized inert gas atoms or the acceleration of atoms of the coating material onto the surface of the component 1. The holding device 8 preferably has a drive device which is connected to the control device 22. The drive device ensures continuous rotation of the component 1 about its longitudinal axis 27.

A feed 16 for reactive gas has an outlet region disposed geodetically above the forward feed device 30 and below the component 1. The feed 16 in this case is an oxidant feed, by which oxygen can be deliberately fed into the coating chamber 2 by the control device 22. In order to heat the component 1, a heating device 9, which is likewise connected to the control device 22, is disposed geodetically above the component 1. A vacuum-pressure measuring device 19, which is likewise connected to the control device 22, is furthermore provided in the coating chamber 2. At least one temperature sensor 17, for example a thermocouple, is disposed on the component 1 for detecting its component temperature or component temperature distribution, and is likewise connected to the control device 22. The vacuum-generating device 18 is also connected to the control device 22.

The control device 22 for carrying out a coating process through the use of an electron-beam PVD method is constructed in a similar manner to the device represented in FIG. 3. Only a connection and interaction between the gas flow control subsystem 21c and the source control 21g may be omitted. The loading chamber is evacuated to a pressure of $10^{-2}$ Pa, with the control being carried out by the subsystem 21h which is the chamber pressure control. The set-point value of the chamber pressure can be prescribed freely in this case.

The component temperature control system 21k detects the reaching of the preheating temperature, in particular 700° C. Thereupon, the chamber pressure is increased to a coating-pressure set-point value of up to 5 Pa by supplying a reactive gas into the preheating chamber through the use of a non-illustrated reactive-gas inlet device. In this case, the component temperature control 21k acts at the same time and keeps the component temperature at 700° C. The chamber pressure control 21h and the chamber atmosphere control 21b are likewise activated and check to determine that the chamber-pressure set-point value is adhered to as the total pressure and that the required chamber atmosphere composition is set up as partial pressures of the individual gases or as the total pressure of the previously adjusted gas feeds. It is not until the chamber pressure control 21h, the component temperature control 21k and the chamber atmosphere control 21b simultaneously signal that the set-point values are adhered to, that further preheating of the component 1 to the seeding temperature is carried out by prescribing a new set-point value for the component temperature. This temperature corresponds to the seeding temperature.

The required coating pressure and the gas atmosphere composition are simultaneously adjusted in the coating chamber 2 by the chamber pressure control subsystem 21h and the chamber atmosphere control subsystem 21b. It is not until the set-point values are simultaneously signaled for both of the values (chamber pressure and gas atmosphere composition) that the electron gun 28 produces an electron beam 33 which is directed at the coating material 31 and evaporates the ceramic coating material. This being the case, the source control 21g, which is activated by the control device 22, adjusts the forward feed of the ceramic coating material 31 by the forward feed device 30 and the power of the electron gun 28 through the power supply 29, to steady-state evaporation conditions.

Deliberate movement control of the component 1 takes place through the use of the motion system subsystem 21m, for particularly favorable utilization of the coating material in a cloud 34 of coating material. The steady-state feed of reactive gas into the coating chamber 2 is set within a defined variation for the chamber atmosphere through the use of the chamber atmosphere control subsystem 21b coupled to the gas flow control subsystem 21c. After the coating has been completed, cooling is carried out as described above.

The invention is distinguished by the fact that, during the coating process, that is to say the deposition of a ceramic thermal barrier coating on a component, a plurality, in particular more than two, process parameters, preferably those essential for achieving a predetermined microstructure of the thermal insulation layer, are adjusted simultaneously and together in a respective set-point value range. In correspondence with the overall process, the system parameters are adjusted in the plant, in addition to the process parameters. Furthermore, a complete coating cycle, including a preheating process, the actual coating process and a cooling process, is coordinated in a predeterminable sequence by a master system. A corresponding control system includes suitable adjustment of the process parameters in the event of disturbances occurring.

We claim:

1. A method for coating a component with a thermal barrier coating, which comprises:

placing a component in a coating chamber with an atmosphere having a controllable atmosphere composition;

maintaining the component at a component temperature;

establishing a vacuum in the coating chamber; and controlling at least two process parameters in a mutually dependent way, the at least two process parameters being selected from the group consisting of vacuum pressure, component temperature and atmosphere composition with a control device, at least during a coating process for depositing a material forming a thermal barrier coating on the component, and placing the at least two process parameters in respective set-point value ranges for growing the thermal barrier coating with a columnar structure on the component.

2. The method according to claim 1, which comprises feeding a reactive gas into the coating chamber during the coating process, and controlling at least one of an input flow rate and a partial pressure of the reactive gas, together with the at least two process parameters, as at least one further process parameter.

3. The method according to claim 2, which comprises feeding a gas selected from the group consisting of oxygen and nitrogen into the coating chamber as the reactive gas.

4. The method according to claim 2, which comprises setting a set-point value range of the partial pressure of the reactive gas at between $10^{-2}$ Pa and 5 Pa.

5. The method according to claim 2, which comprises setting a set-point value range of the partial pressure of the reactive gas at about $5 \times 10^{-1}$ Pa.

6. The method according to claim 1, which comprises moving the component relative to a coating source for producing the material of the thermal barrier coating, and controlling at least one of a material output of the coating source and a relative motion of the component in common with the at least two process parameters.

7. The method according to claim 1, which comprises setting a set-point value range of the component temperature at between 900° C. and 1150° C., and setting a set-point value range of the vacuum pressure at between $10^{-3}$ Pa and 10 Pa.

8. The method according to claim 1, which comprises setting a set-point value range of the component temperature at between 950° C. and 1050° C., and setting a set-point value range of the vacuum pressure at between 10 Pa and 5 Pa.

9. The method according to claim 1, which comprises establishing substantially uniform heating through the component having sub-regions of greatly different mass concentration.

10. The method according to claim 1, which comprises establishing substantially uniform heating through a turbine blade as the component having sub-regions of greatly different mass concentration.

11. The method according to claim 1, which comprises establishing substantially uniform heating through a rotating blade or guide vane of an industrial gas turbine as the component having sub-regions of greatly different mass concentration.

12. The method according to claim 1, which comprises establishing substantially uniform heating through the component having a first sub-region with a first wall thickness and a second sub-region with a second wall thickness in a ratio of the first and second wall thicknesses of 1:5 to 1:200.

13. The method according to claim 1, which comprises establishing substantially uniform heating through the component having a first sub-region with a first wall thickness and a second sub-region with a second wall thickness in a ratio of the first and second wall thicknesses of 1:10 to 1:100.

14. The method according to claim 1, which comprises setting a set-point value range of the component temperature at between 900° C. and 1150° C., and setting a set-point value range of the vacuum pressure at between $10^{-1}$ Pa and $10^{-3}$ Pa.

15. The method according to claim 1, which comprises setting a set-point value range of the component temperature at between 950° C. and 1050° C., and setting a set-point value range of the vacuum pressure at between $10^{-2}$ Pa and $10^{-4}$ Pa.

* * * * *